United States Patent
Nishikawa et al.

(10) Patent No.: US 9,776,145 B2
(45) Date of Patent: Oct. 3, 2017

(54) LIQUID MIXING METHOD AND DEVICE

(75) Inventors: Daisuke Nishikawa, Kobe (JP);
Takeshi Yamashita, Kobe (JP);
Makoto Nishimura, Kobe (JP); Koji Noishiki, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 812 days.

(21) Appl. No.: 14/125,417

(22) PCT Filed: Jun. 7, 2012

(86) PCT No.: PCT/JP2012/003721
§ 371 (c)(1),
(2), (4) Date: Dec. 11, 2013

(87) PCT Pub. No.: WO2012/176391
PCT Pub. Date: Dec. 27, 2012

(65) Prior Publication Data
US 2014/0133262 A1 May 15, 2014

(30) Foreign Application Priority Data

Jun. 22, 2011 (JP) ................................. 2011-138868

(51) Int. Cl.
*B01F 3/08* (2006.01)
*B01F 13/00* (2006.01)
(Continued)

(52) U.S. Cl.
CPC .......... *B01F 3/0876* (2013.01); *B01F 5/0647* (2013.01); *B01F 13/0071* (2013.01);
(Continued)

(58) Field of Classification Search
CPC .. B01F 13/0071; B01F 3/0876; B01F 5/0647; B01J 2219/00889; B01J 2219/0903; B01J 19/0093
(Continued)

(56) References Cited

U.S. PATENT DOCUMENTS

2003/0015194 A1* 1/2003 Schiewe .............. A61K 9/0073
128/203.15
2004/0055891 A1* 3/2004 Pamula ............... B01F 11/0071
205/98
(Continued)

FOREIGN PATENT DOCUMENTS

EP 2 283 918 A2 2/2011
EP 2 283 918 A3 2/2011
(Continued)

OTHER PUBLICATIONS

Extended European Search Report issued Oct. 30, 2014 in Patent Application No. 12803145.7.
(Continued)

*Primary Examiner* — Charles Cooley
*Assistant Examiner* — Marc C Howell
(74) *Attorney, Agent, or Firm* — Oblon, McClelland, Maier & Neustadt, L.L.P.

(57) ABSTRACT

Provided is a method of mixing first and second liquids having mutual solubility inside a mixing flow channel formed by a micro flow channel. This method includes: causing the first and second liquids to be joined to each other inside the mixing flow channel; and forming a slug flow, in which mixing subject cells (60) formed by the joined liquid and insoluble fluid cells (63) formed by an insoluble fluid are alternately arranged, inside a flow channel at the downstream side of an insoluble fluid supply position in a manner such that the insoluble fluid having insolubility with respect to both mixing subject liquids is supplied to the joined liquid flowing through the flow channel in a direction intersecting the flow channel so that the joined liquid is divided with a gap therebetween, thereby mixing the first mixing subject liquid and the second mixing subject liquid contained in
(Continued)

each mixing subject cell inside the downstream flow channel.

3 Claims, 10 Drawing Sheets

(51) Int. Cl.
   *B01J 19/00* (2006.01)
   *B81B 1/00* (2006.01)
   *B01F 5/06* (2006.01)
(52) U.S. Cl.
   CPC .......... *B01J 19/0093* (2013.01); *B81B 1/00* (2013.01); *B01J 2219/00783* (2013.01); *B01J 2219/00889* (2013.01); *B01J 2219/00898* (2013.01); *B01J 2219/00903* (2013.01)
(58) Field of Classification Search
   USPC ...................................................... 366/101
   See application file for complete search history.

(56) References Cited

U.S. PATENT DOCUMENTS

| 2004/0197275 | A1* | 10/2004 | Jongen | A61K 9/0075 |
| | | | | 424/46 |
| 2005/0087122 | A1 | 4/2005 | Ismagliov et al. | |
| 2005/0272159 | A1* | 12/2005 | Ismagilov | B01F 5/0646 |
| | | | | 436/34 |
| 2006/0108012 | A1 | 5/2006 | Barrow et al. | |
| 2007/0172954 | A1 | 7/2007 | Ismagilov et al. | |
| 2010/0120635 | A1* | 5/2010 | Davies | B01F 5/0057 |
| | | | | 506/26 |
| 2010/0233026 | A1 | 9/2010 | Ismagliov et al. | |
| 2011/0268616 | A1 | 11/2011 | Noishiki et al. | |
| 2012/0234755 | A1 | 9/2012 | Noishiki et al. | |

FOREIGN PATENT DOCUMENTS

| EP | 02 384 810 A1 | 11/2011 | |
| EP | 2 500 086 A2 | 9/2012 | |
| EP | 2 500 086 A3 | 9/2012 | |
| JP | 2006 504512 | 2/2006 | |
| JP | 2006 102681 | 4/2006 | |
| JP | 2006 167719 | 6/2006 | |
| JP | 2006-167719 | 6/2006 | |
| JP | 2006-239640 A | 9/2006 | |
| JP | 2006 320878 | 11/2006 | |
| JP | 2007-254176 A | 10/2007 | |
| JP | 2008 168173 | 7/2008 | |
| JP | 2008 194593 | 8/2008 | |
| JP | 2010-162427 A | 7/2010 | |
| JP | 2010-162428 A | 7/2010 | |
| JP | WO 2010082433 A1 * | 7/2010 | .......... B01J 19/0093 |
| WO | WO 2010/082433 A1 | 7/2010 | |

OTHER PUBLICATIONS

Written Opinion of the International Searching Authority Issued Aug. 28, 2012 in PCT/JP12/003721 Filed Jun. 7, 2012.
International Search Report Issued Aug. 28, 2012 in PCT/JP12/003721 Filed Jun. 7, 2012.

* cited by examiner

FIG. 5
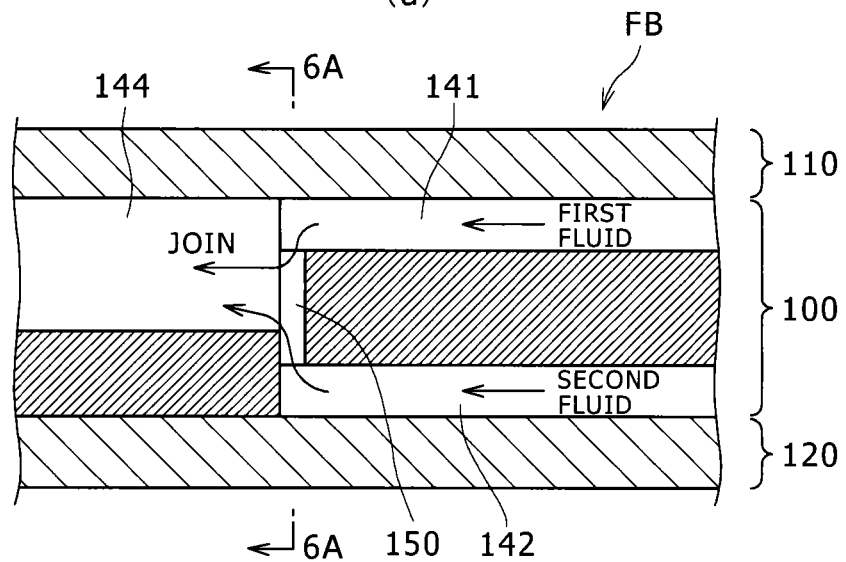
(a)
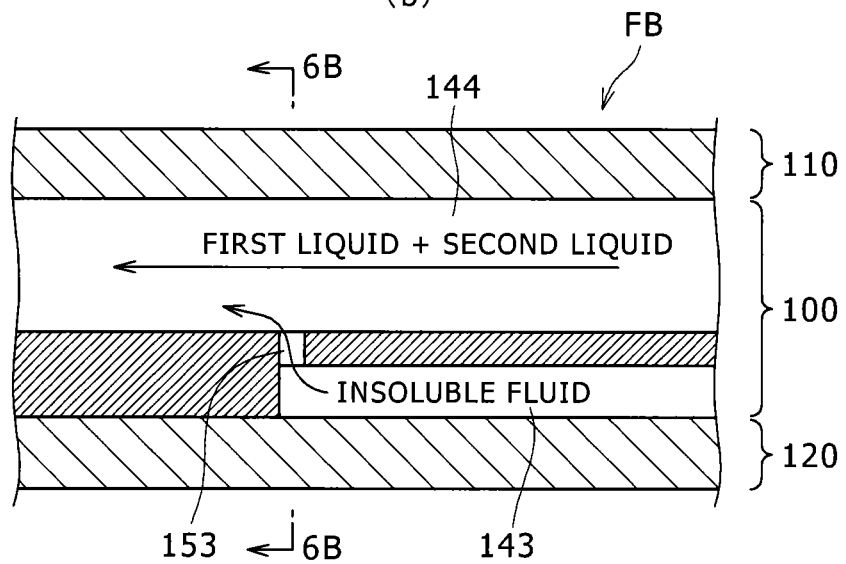
(b)

FIG. 6
(a)
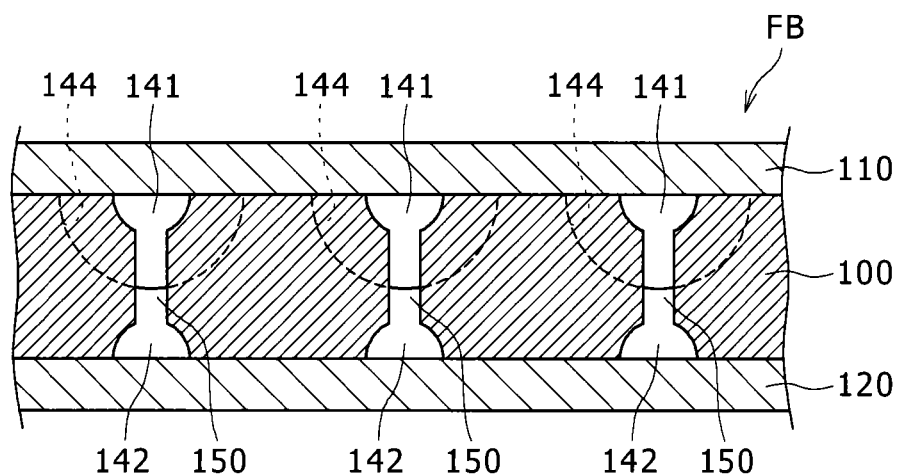
(b)
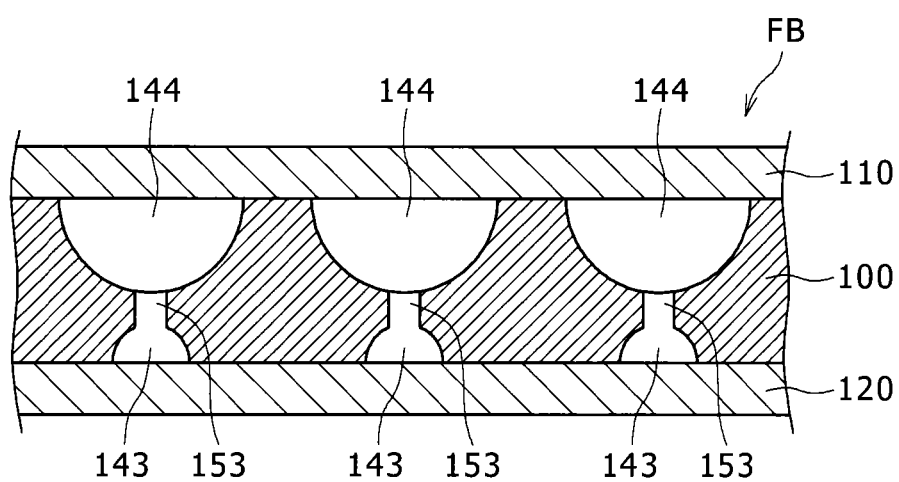

FIG. 7
(a)
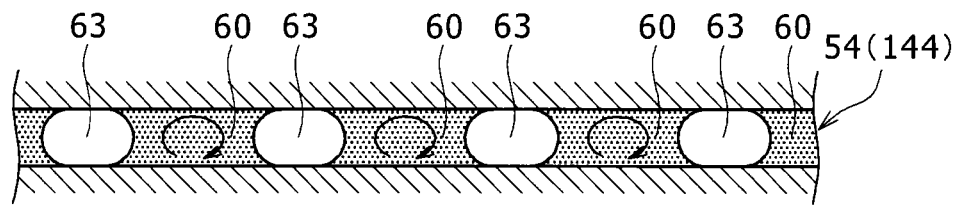
(b)
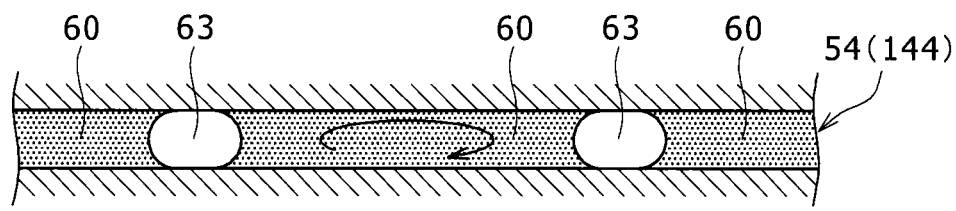
FIG. 8
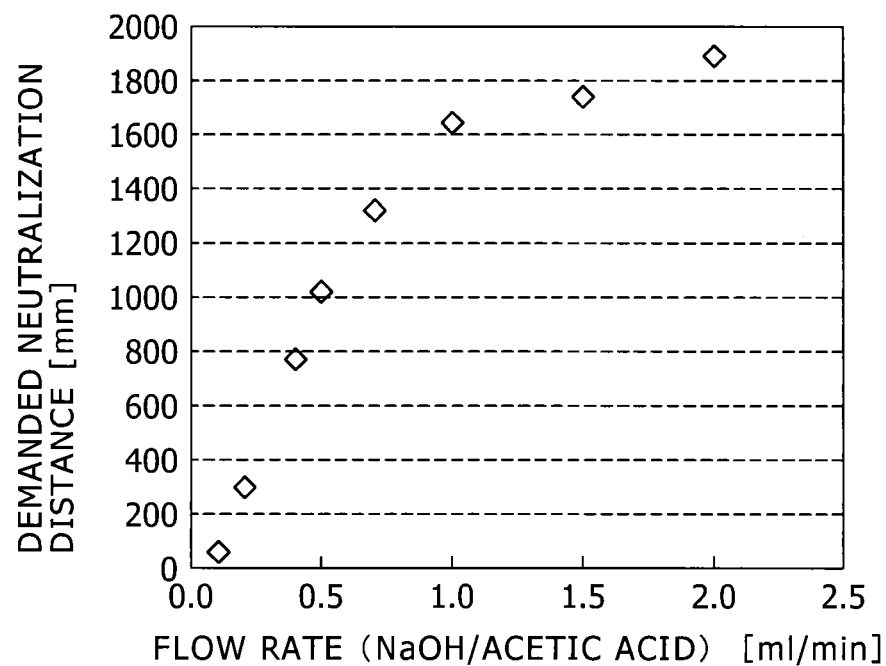

FIG. 9
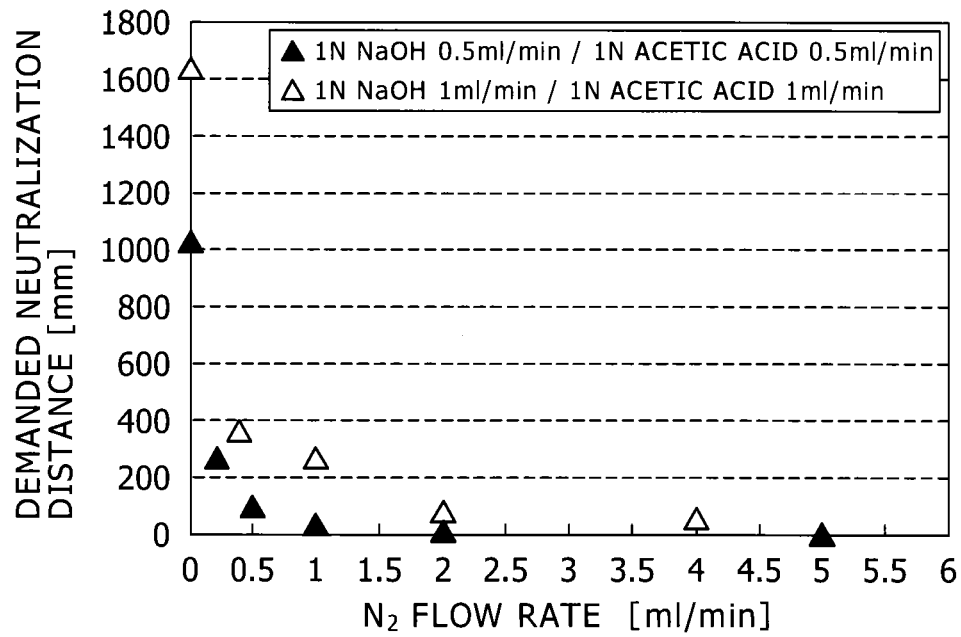
(a)
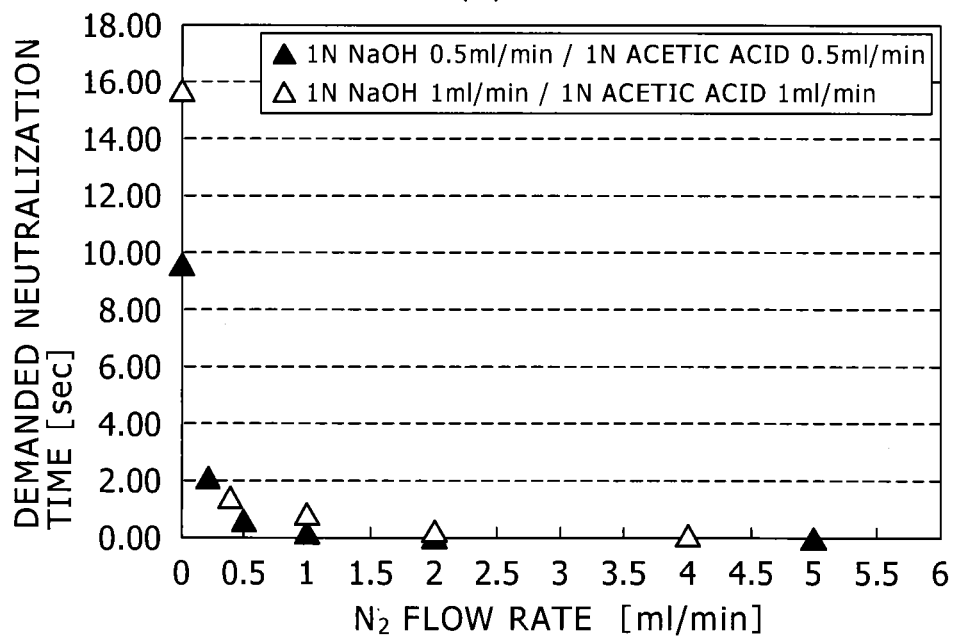
(b)

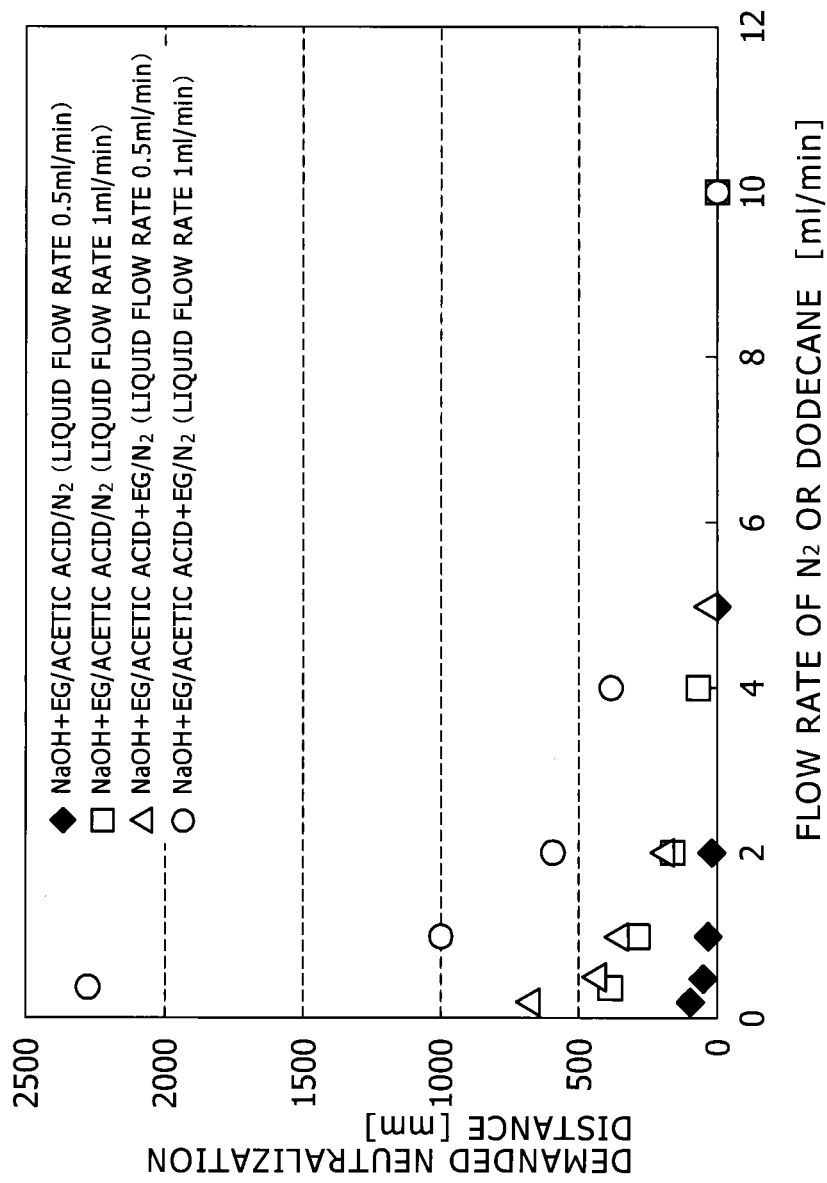

LIQUID MIXING METHOD AND DEVICE

TECHNICAL FIELD

The present invention relates to a method and a device for mixing liquids having mutual solubility inside a micro flow channel.

BACKGROUND ART

Hitherto, as a method of producing a desired reactive product by mixing mutual soluble liquids (reactants) in a contact state, there is known a method of using a flow channel forming body called a micro channel reactor (Patent Document 1). The micro channel reactor includes a base body having a groove formed in a surface thereof, and the micro flow channel is formed by the groove. When mixing subject liquids are caused to flow into the micro flow channel, the contact area between the mixing subject liquids per unit volume drastically increases, so that the efficiency of mixing the mixing subject liquids is improved.

In the micro channel reactor, a method of further promoting the mixing process has been desired in addition to the method of increasing the contact area. The promotion of the mixing process may shorten the flow channel length of the micro flow channel demanded for completing the mixing process, so that the entire micro channel reactor may be decreased in size. Further, a decrease in time demanded for the mixing process also suppresses an unnecessary side reaction during the mixing process.

As a method of promoting the mixing process, Patent Document 2 discloses a method in which plural convex portions are formed inside a flow channel so as to promote the mixing process. Further, Patent Document 3 discloses a method in which a pair of electrodes is provided in the middle of a mixing flow channel and an AC voltage is applied to the pair of electrodes. However, when plural minute concave portions are formed inside the flow channel as in Patent Document 2, the shape of the flow channel becomes complex, so that the number of steps of forming and managing (particularly, cleaning) the flow channel increases. Further, the arrangement of the electrodes in Patent Document 3 also complicates the structure of the micro channel reactor and drastically increases the cost thereof.

CITATION LIST

Patent Document

Patent Document 1: JP 2008-168173 A
Patent Document 2: JP 2006-102681 A
Patent Document 3: JP 2006-320878 A

SUMMARY OF INVENTION

It is an object of the present invention to provide a method and a device which mix liquids using a flow channel forming body forming a mixing flow channel and promote the mixing process without noticeably complicating the shape of the mixing flow channel or requiring huge equipment for promoting the mixing process.

In order to attain this object, the present inventor with others have considered a method of forcedly forming a slug flow inside a flow channel for mixing the mixing subject liquids and found out the noticeably promoted mixing process as a result of the method. The "slug flow" mentioned herein indicates a flow in which cells formed by the mixing subject liquid and cells formed by a fluid other than the mixing subject liquid are alternately arranged inside the micro flow channel in the flow channel direction. According to the observation, the process of mixing the mixing subject liquids inside the cells containing the mixing subject liquids is drastically promoted by the formation of the slug flow. It is supposed that this effect is obtained since the mixing subject liquids are mixed inside the respective minute cells and a minute circulation flow effective for promoting the process of mixing the mixing subject liquids inside the respective cells is formed.

The present invention is made from such a viewpoint, and provides a method useful for mixing first and second liquids having mutual solubility and corresponding to mixing subject liquids inside a mixing flow channel formed as a micro flow channel. This method includes: causing the first and second liquids to be joined to each other inside the mixing flow channel; and forming a slug flow, in which mixing subject cells formed by the joined liquid and insoluble fluid cells formed by an insoluble fluid are alternately arranged, inside a flow channel at the downstream side of an insoluble fluid supply position in a manner such that the insoluble fluid having insolubility with respect to the first and second liquids is supplied to the joined liquid flowing through the flow channel so that the joined liquid is divided with a gap therebetween, thereby mixing the first and second liquids contained in each mixing subject cell inside the downstream flow channel.

Here, the "first and second liquids having mutual solubility" indicate a fluid in which a mixed liquid formed by mixing such liquids is not separated into a laminar state even when the mixed liquid is held in a static state, and exemplified is a case in which both mixing subject liquids have a high hydrophilic property or a case in which both mixing subject liquids have a high lipophilic property. Meanwhile, as the "insoluble fluid having insolubility with respect to the first liquid and the second liquid", for example, oil or a gas (a nitrogen gas, an inert gas, a hydrocarbon gas, or the like) having low water solubility is exemplified when the first and second liquids have a high hydrophilic property or for example, water, a liquid having a high hydrophilic property, or a gas (a nitrogen gas, an inert gas, or the like) having low solubility with respect to oil is exemplified when the first and second liquids have a high lipophilic property.

Further, the present invention provides a liquid mixing device best suitable for the above-described mixing process. The liquid mixing device includes: a flow channel forming body which forms a mixing flow channel for mixing first and second liquids having mutual solubility; a first liquid supply unit which supplies the first liquid to the flow channel forming body; a second liquid supply unit which supplies the second liquid to the flow channel forming body; and an insoluble fluid supply unit which supplies an insoluble fluid having insolubility with respect to both first and second liquids to the flow channel forming body. The mixing flow channel formed by the flow channel forming body includes a first liquid introduction unit into which the first liquid supplied from the first liquid supply unit is introduced, a second liquid introduction unit into which the second liquid supplied from the second liquid supply unit is introduced and which includes a terminal end communicating with a terminal end of the first liquid introduction unit so that the introduced second liquid is joined to the first liquid introduced to the first liquid introduction unit, a mixing unit which is connected to the terminal ends of both liquid introduction units and mixes the liquids joined to each other at the terminal ends in a flowing state, and an insoluble fluid introduction unit which includes a terminal end communicating with the mixing unit so as to form a slug flow, in which mixing subject cells formed by the joined liquid and insoluble fluid cells formed by an insoluble fluid are alternately arranged, inside the mixing unit at the downstream side of an insoluble fluid introduction position in a manner such that the insoluble fluid supplied from the insoluble fluid supply unit is introduced to the joined liquid flowing through the mixing unit at a middle position of the mixing unit in a direction intersecting the mixing unit.

BRIEF DESCRIPTION OF DRAWINGS

FIG. 5(a) is a front cross-sectional view illustrating a communication portion between a first liquid groove and a second liquid groove in the substrate, and FIG. 5(b) is a front cross-sectional view illustrating a communication portion between a middle portion of a mixing groove and an insoluble fluid groove in the substrate FIG. 6(a) is a cross-sectional view taken along the line 6A-6A of FIG. 5(a), and FIG. 6(b) is a cross-sectional view taken along the line 6B-6B of FIG. 5(b).

FIGS. 7(a) and 7(b) are cross-sectional views illustrating a slug flow that is formed inside the mixing groove.

FIG. 8 is a graph illustrating a relation between each of flow rates of aqueous sodium hydroxide and acetic acid aqueous solution and a distance demanded for neutralization in a first example of the present invention.

FIGS. 9(a) and 9(b) are graphs illustrating a relation between a flow rate of a nitrogen gas and a distance demanded for neutralization of aqueous sodium hydroxide and acetic acid aqueous solution in the first example of the present invention, and FIG. 9(b) is a graph illustrating a relation between a flow rate of a nitrogen gas and a time demanded for neutralization.

FIG. 11 is a graph illustrating a relation between a flow rate of a nitrogen gas and a distance demanded for neutralization in third and fourth examples of the present invention.

DESCRIPTION OF EMBODIMENTS

Figure 1:
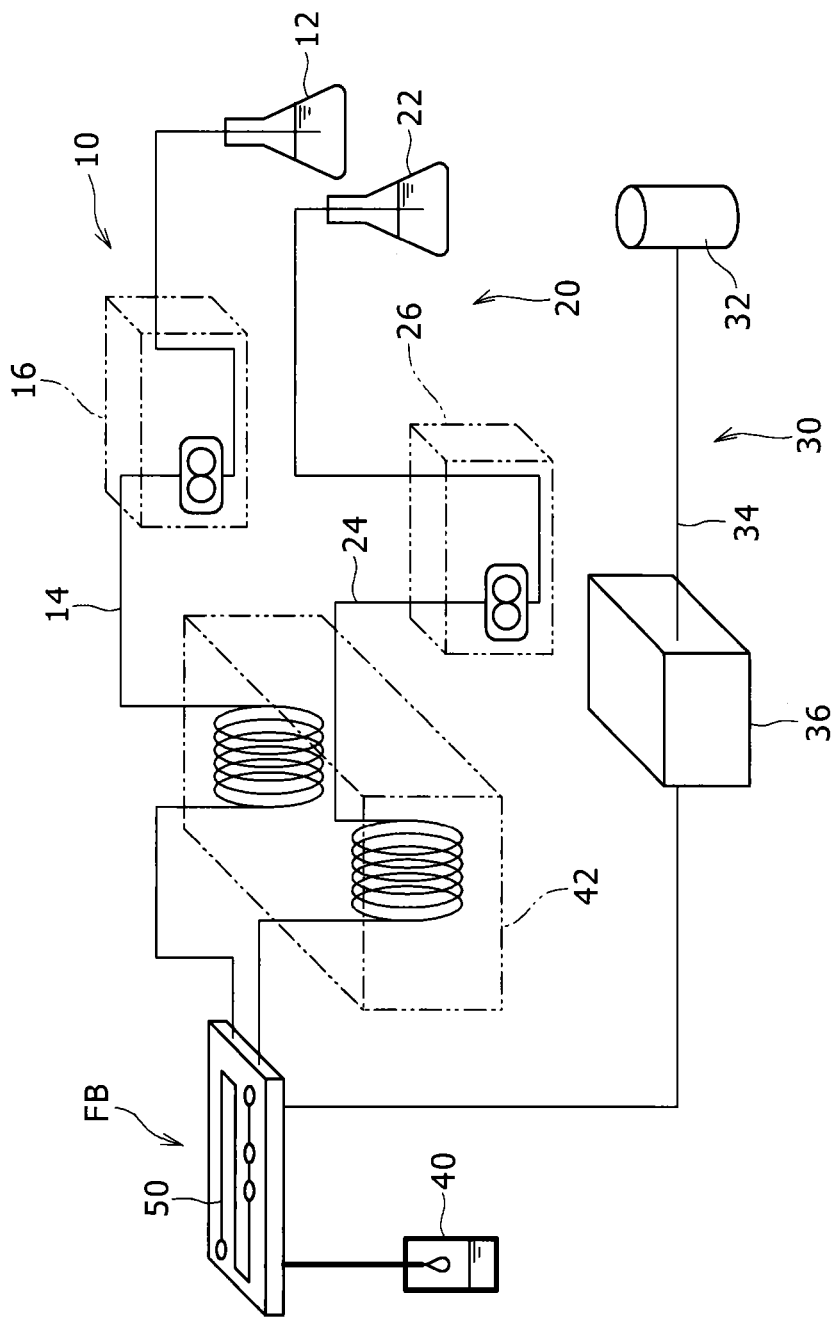
FIG. 1 is a diagram illustrating an overall configuration of a liquid mixing device according to an embodiment of the present invention.

Exemplary embodiments of the present invention will be described by referring to the drawings.

Figure 2:
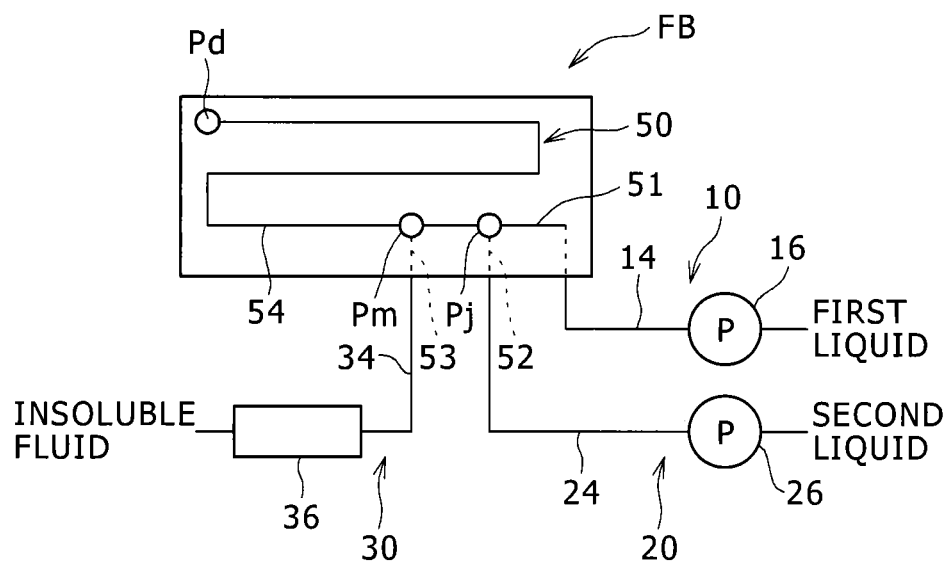
FIG. 2 is a schematic flowsheet illustrating a flow of each fluid in the liquid mixing device.
Figure 3:
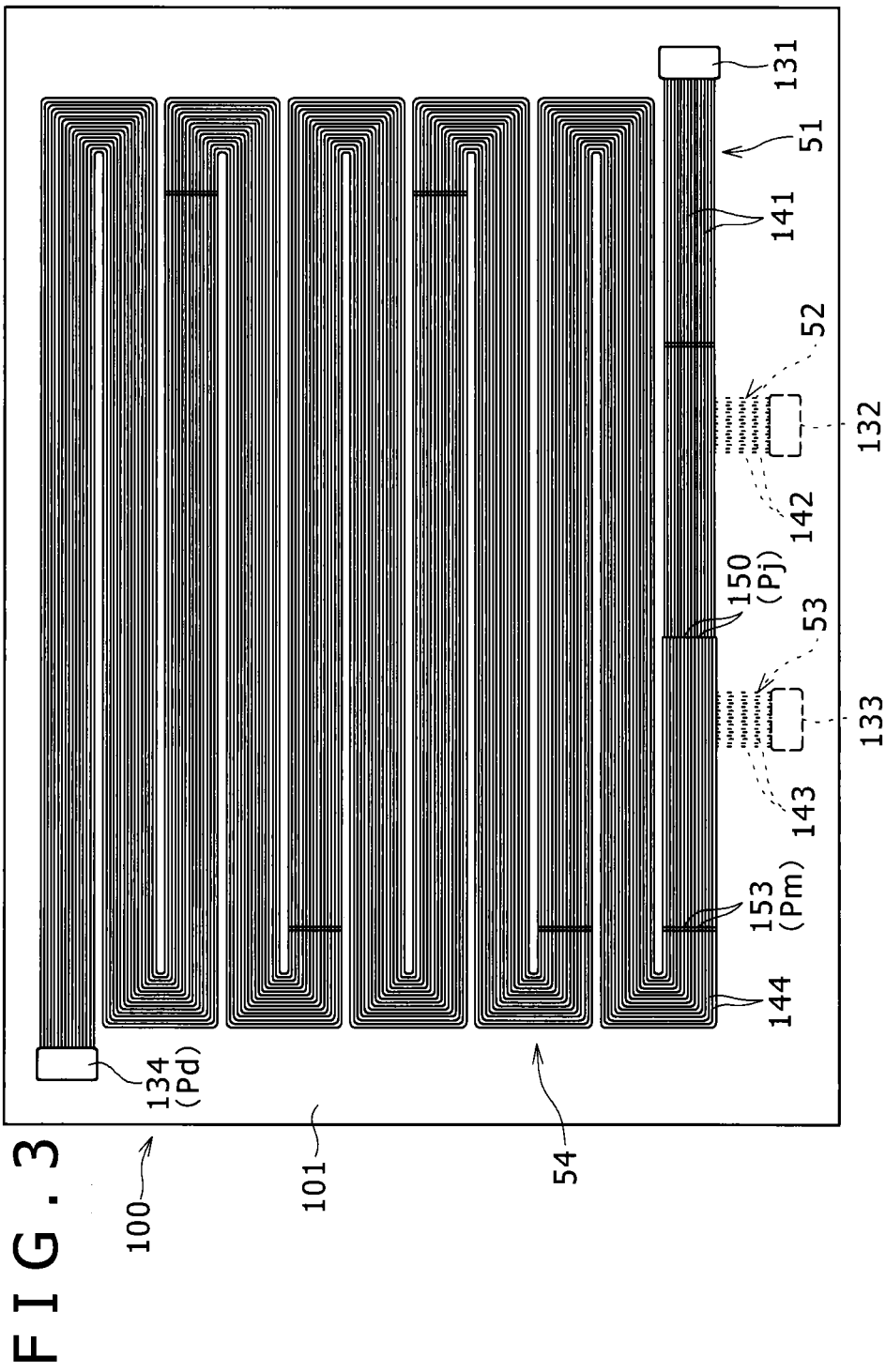
FIG. 3 is a plan view illustrating a first side surface of a substrate that constitutes the liquid mixing device.
Figure 4:
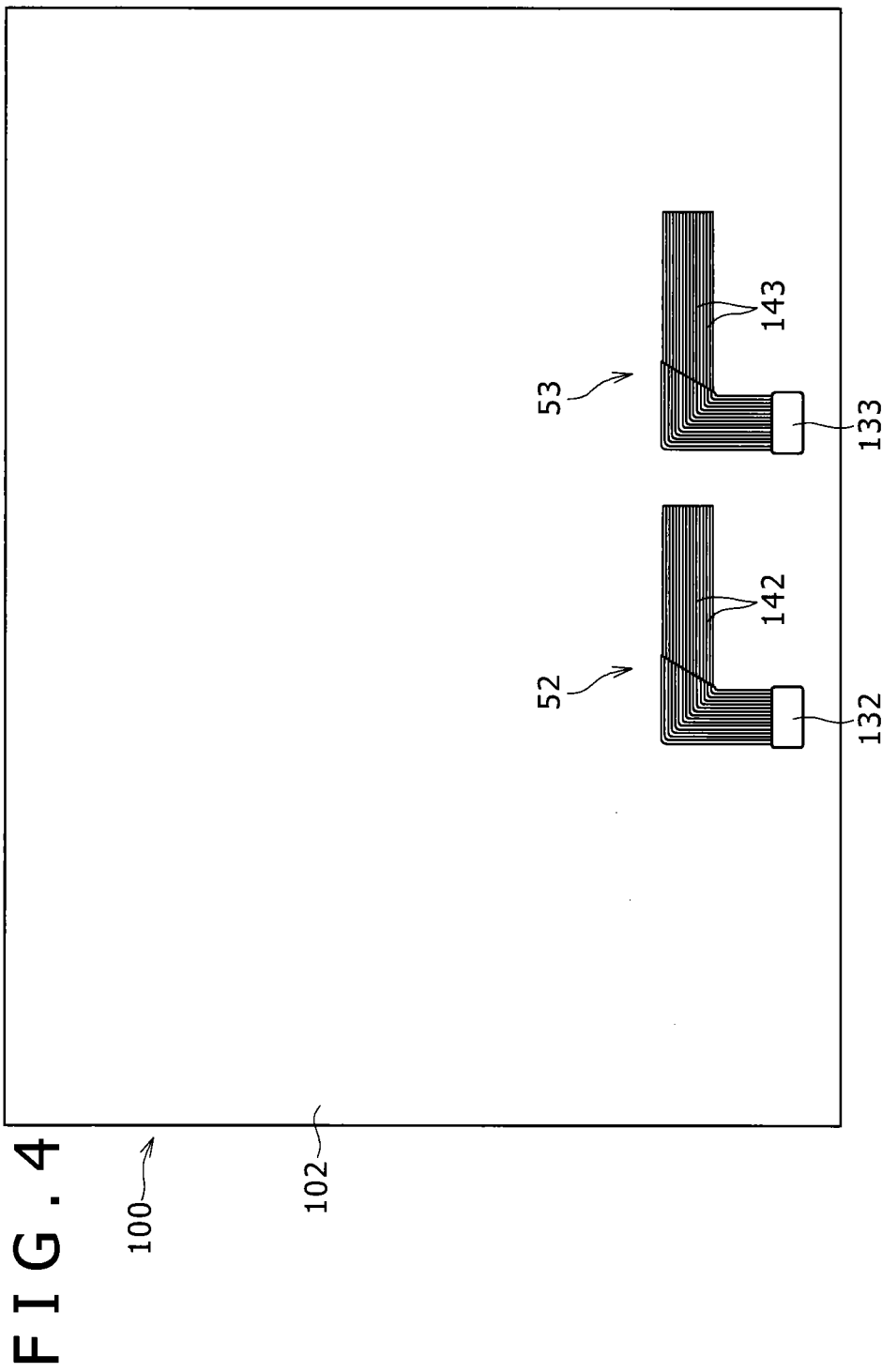
FIG. 4 is a bottom view illustrating a second side surface of the substrate.

FIGS. 1 and 2 illustrate a liquid mixing device according to an embodiment. The liquid mixing device is used to mix a first liquid and a second liquid having mutual solubility, and includes a flow channel forming body FB which forms a mixing flow channel 50 used for the mixing process, a first liquid supply unit 10 which supplies the first liquid to the flow channel forming body, a second liquid supply unit 20 which supplies the second liquid to the flow channel forming body FB, an insoluble fluid supply unit 30 which supplies an insoluble fluid, that is, a fluid having insolubility with respect to both the first liquid and the second liquid to the flow channel forming body, and a recovery container 40.

The first liquid supply unit 10 includes a first liquid container 12 which stores the first liquid, a first liquid pipe 14 which connects the inside of the first liquid container 12 to the flow channel forming body FB, and a first liquid pump 16 which pressure-feeds the first liquid inside the first liquid container 12 to the flow channel forming body FB through the first liquid pipe 14. Similarly, the second liquid supply unit 20 includes a second liquid container 22 which stores the second liquid, a second liquid pipe 24 which connects the inside of the second liquid container 22 to the flow channel forming body FB, and a second liquid pump 26 which pressure-feeds the second liquid inside the second liquid container 22 to the flow channel forming body FB through the second liquid pipe 24.

Further, the liquid mixing device includes a constant-temperature bath 42 which is common to the first liquid supply unit 10 and the second liquid supply unit 20. The constant-temperature bath 42 is used to keep the first and second liquids supplied to the flow channel forming body FB at a constant temperature, but may be appropriately removed depending on the purpose of use. In this embodiment, the middle portions of the respective pipes 14 and 24 are formed in a spiral shape, and these portions are immersed into hot water stored in the constant-temperature bath 42.

The first liquid and the second liquid as the targets of the present invention may have solubility, but the solubility may be water solubility or non-water solubility. For example, both liquids may be water or water solution or both liquids may be oil-based solution. Further, the mixing ratio may be also freely set.

The insoluble fluid supply unit 30 includes an insoluble fluid container 32 which stores an insoluble fluid, an insoluble fluid pipe 34 which connects the inside of the insoluble fluid container 32 to the flow channel forming body FB, and a flow rate adjuster 36 which adjusts the flow rate of the insoluble fluid supplied from the insoluble fluid container 32 to the flow channel forming body FB through the insoluble fluid pipe 34. In this embodiment, a gas is used as the insoluble fluid, and the insoluble fluid container 32 is formed by a gas cylinder which encloses the gas therein in a compressed state. Then, the gas as the insoluble fluid is pressure-fed to the flow channel forming body FB by the pressure inside the gas cylinder.

The insoluble fluid which is used in the present invention may have insolubility with respect to both the first liquid and the second liquid, and the insoluble fluid may be a gas or a liquid. For example, in a case where the first and second liquids are water or water solution, an insoluble gas or liquid may be used. Then, in a case where the first and second liquids are oil-based solution, for example, water may be used. In a case where a liquid is used as the insoluble fluid, insoluble fluid supplying liquid pumps like the first and second liquid pumps 16 and 26 may be disposed in the insoluble fluid supply unit 30. Further, the flow rate adjuster 36 may be removed depending on the purpose of use.

As illustrated in FIG. 2, the mixing flow channel 50 which is formed by the flow channel forming body FB includes first and second liquid introduction units 51 and 52 into which the first liquid and the second liquid are respectively introduced, a mixing unit 54, and an insoluble fluid introduction unit 53 into which the insoluble fluid is introduced.

The first liquid introduction unit 51 includes an inlet end which is connected to the first liquid pipe 14 of the first liquid supply unit 10 and a terminal end which is disposed on the opposite side to the inlet end. Similarly, the second liquid introduction unit 52 includes an inlet end which is connected to the second liquid pipe 24 of the second liquid supply unit 20 and a terminal end which is disposed on the opposite side to the inlet end. The terminal ends of the first and second liquid introduction units 51 and 52 communicate with a predetermined joining position Pj so that the first liquid and the second liquid introduced into the respective liquid introduction units 51 and 52 are joined to each other at the joining position Pj.

The mixing unit 54 is used to mix both fluids joined to each other at the joining position Pj in a flowing state, and has a flow channel length demanded for the mixing process. The mixing unit 54 includes a start end connected to the terminal ends of both liquid introduction units 51 and 52 at the joining position Pj and an outlet end which is disposed on the opposite side to the start end, and the outlet end is connected to the recovery container 40 so that the mixed liquid is discharged to the recovery container 40 at a predetermined discharge position Pd.

The insoluble fluid introduction unit 53 includes an inlet end which is connected to the insoluble fluid pipe 34 of the insoluble fluid supply unit 30 and a terminal end which is disposed on the opposite side to the inlet end, and the terminal end is connected to the mixing unit 54 so that the insoluble fluid is introduced to the joined liquid flowing through the mixing unit 54 at the middle position Pm of the mixing unit 54 from a direction (in this embodiment, a plate thickness direction of a substrate 100) intersecting the mixing unit 54.

Next, the detailed structure of the flow channel forming body FB will be described by referring to FIGS. 3 to 6.

The flow channel forming body FB includes a base body which is provided with a groove forming the mixing flow channel 50 and a lid body which is mounted on the base body so as to cover the groove. In the flow channel forming body FB according to the embodiment, the base body is formed by the substrate 100 illustrated in FIGS. 3 to 6, and the lid body includes a first lid plate 110 and a second lid plate 120 illustrated in FIGS. 5 and 6. In this embodiment, the substrate 100 is formed in a flat plate shape with a first rectangular side surface 101 and a second rectangular side surface 102 on the rear side thereof, and the first lid plate 110 and the second lid plate 120 are respectively laminated along with the substrate 100 so as to be superimposed on the first side surface 101 and the second side surface 102 of the substrate 100.

In the liquid mixing device, since both side surfaces 101 and 102 of the substrate 100 are provided with the grooves, a liquid mixing device having a compact structure and capable of performing an efficient mixing process is constructed. Specifically, the substrate 100 includes a first liquid inlet port 131, a second liquid inlet port 132, an insoluble fluid inlet port 133, an outlet port 134, plural first liquid grooves 141, plural second liquid grooves 142, plural insoluble fluid grooves 143, plural mixing grooves 144, a joining hole 150, and an insoluble fluid introduction hole 153. These components are formed by performing an etching process on the substrate 100. The respective ports 131 to 134 are all formed by penetration holes which penetrate the substrate 100 in the thickness direction, and the first lid plate 110 and the second lid plate 120 also have the same plural penetration holes provided at the corresponding positions of the respective ports 131 to 134. However, the second lid plate 120 at the lowermost stage does not include the penetration holes in order to seal the fluid. The first lid plate 110 at the uppermost stage is provided with the penetration holes, and the respective penetration holes are respectively connected with the first liquid pipe 14, the second liquid pipe 24, the insoluble fluid pipe 34, and the recovery container 40.

The first liquid grooves 141 are formed in the first side surface 101 so as to form the first liquid introduction unit 51. The first liquid grooves 141 extend along the long edge of the substrate 100 in a linear shape in parallel to one another from the first liquid inlet port 131 to the joining position Pj. Each of the first liquid grooves 141 has a depth smaller than ½ of the thickness of the substrate 100.

The number of the second liquid grooves 142 is equal to the number of the first liquid grooves 141, and both grooves are formed in the second side surface 102 while being disposed in parallel to one another so as to form the second liquid introduction unit 52. Each of the second liquid grooves 142 is formed in an L-shape including a portion which approaches the first liquid groove 141 from the second liquid inlet port 132 in a direction perpendicular thereto and a portion of which the direction is changed by 90° from the above-described portion toward the downstream side and which extends to the joining position Pj along the first liquid groove 141 at the rear side of the corresponding first liquid groove 141. Each of the second liquid grooves 142 has a depth equal to the depth of each of the first liquid grooves 141, that is, a depth smaller than ½ of the thickness of the substrate 100.

Joining holes 150 penetrate the substrate 100 in the thickness direction at the joining position Pj, so that the terminal ends of the first liquid grooves 141 communicate with the terminal ends of the second liquid grooves 142. That is, the first liquid flowing through the first liquid groove 141 may be joined to the second liquid flowing through the second liquid grooves 142.

The number of the mixing grooves 144 is equal to the number of the first liquid grooves 141, and both grooves are formed in the first side surface 101 while being parallel to one another so as to form the mixing unit 54. Each of the mixing grooves 144 is formed in a shape in which the mixing groove is connected to the terminal end of each of the first liquid grooves 141 at the joining position Pj and reaches the outlet port 134 in a meandering manner from the joining position Pj. The mixing groove 144 has a depth (in this embodiment, a depth larger than ½ of the thickness of the substrate 100) larger than those of both liquid grooves 141 and 142, and communicates with both liquid grooves 141 and 142 through each joining hole 150. Accordingly, the first liquid and the second liquid which are joined to each other at the joining hole 150 may flow into the mixing groove 144.

The number of the insoluble fluid grooves 143 is equal to the number of the mixing grooves 144, and both grooves are formed in the second side surface 102 while being parallel to one another so as to form the insoluble fluid introduction unit 53. Each of the insoluble fluid grooves 143 is formed in an L-shape including a portion which approaches the mixing groove 144 from the insoluble liquid inlet port 133 in a direction perpendicular thereto and a portion of which the direction is changed by 90° from the above-described portion toward the downstream side and which extends to the middle position Pm along the mixing groove 144 at the rear side of the corresponding mixing groove 144. Each of the insoluble fluid grooves 143 has a depth smaller than ½ of the thickness of the substrate 100.

The insoluble fluid introduction hole 153 penetrates the substrate 100 in the thickness direction at the middle position Pm, so that the middle portion of the mixing groove 144 communicates with the terminal end of the insoluble fluid groove 143. That is, the insoluble fluid flowing through the insoluble fluid groove 143 may be introduced into the liquid (the liquid formed by joining the first liquid and the second liquid to each other) flowing through the mixing groove 144.

The first lid plate 110 is bonded to the substrate 100 in a superimposed state so as to cover the first side surface 101, so that the first liquid groove 141 and the mixing groove 144 formed in the first side surface 101 are sealed. Accordingly, the first liquid introduction unit 51 and the mixing unit 54 are respectively constructed. Similarly, the second lid plate 120 is bonded to the substrate 100 in a superimposed state so as to cover the second side surface 102, so that the second liquid groove 142 and the insoluble fluid groove 143 formed in the second side surface 102 are sealed. Accordingly, the second liquid introduction unit 52 and the insoluble fluid introduction unit 53 are respectively constructed.

Furthermore, the substrate 100 may be alternately laminated with the lid plate over plural stages. The laminated body may perform a mixing process on a larger amount of liquid. Further, since the lid plate which is interposed between the respective substrates 100 covers both the first side surface 101 of one substrate 100 and the second side surface 102 of the other substrate 100, the flow channel forming body may be further decreased in size.

Next, a method of mixing the first liquid and the second liquid using the liquid mixing device will be described.

The first liquid and the second liquid which are supplied from the first liquid supply unit 10 and the second liquid supply unit 20 to the flow channel forming body 100 are respectively introduced into the first liquid introduction unit 51 (the first liquid groove 141) of the flow channel forming body 100 and the second liquid introduction unit 52 (the second liquid groove 142) of the flow channel forming body 100 and are joined to each other through the joining hole 150 at the joining position Pj (FIG. 5(a)). Then, both liquids are mixed while flowing through the downstream mixing unit 54 (the mixing groove 144).

As a characteristic point of this method, the insoluble fluid is supplied from the insoluble fluid supply unit 30 to the flow channel forming body 100 in addition to the first liquid and the second liquid and the insoluble fluid is introduced into the mixing unit 54 at the middle position Pm through the insoluble fluid introduction unit 53 (the insoluble fluid groove 143 and the insoluble fluid introduction hole 153) of the flow channel forming body 100. Then, the supply flow rates of the first liquid, the second liquid, and the insoluble fluid are set so as to form a slug flow at the downstream side of the middle position Pm in a manner such that the insoluble fluid divides the liquid (the liquid formed by joining the first liquid and the second liquid to each other; hereinafter, the liquid will be referred to as a "joined liquid") flowing through the mixing unit 54 with a gap therebetween.

As illustrated in FIGS. 7(a) and 7(b), the "slug flow" mentioned herein indicates a flow in which a mixing subject cell 60 as the joined liquid and an insoluble fluid cell 63 as the insoluble fluid are alternately arranged. The formation of the slug flow drastically promotes the process of mixing the first liquid and the second liquid flowing through the mixing unit 54 as will be described in Examples below. It is considered that this effect is obtained because the joined liquid is divided into the mixing subject cells 60 each having an extremely small volume so as to be mixed therein and a circulation flow effective for the mixing process inside the respective mixing subject cells 60 is formed.

The volume ratio between the mixing subject cell 60 and the insoluble fluid cell 63 in the slug flow may be freely set by the adjustment of the introduction flow rate of the insoluble fluid. Specifically, as will be described in Example below, the volume (size) of each mixing subject cell 60 may be decreased as the introduction flow rate of the insoluble fluid increases. As obvious from FIGS. 7(a) and 7(b), the degree in which the circulation flow contributes to the promotion of the mixing process in the mixing subject cell 60 increases as the volume of the cell 60 is suppressed, and hence the mixing promotion effect is improved in actuality. In contrast, when the occupancy of the volume of the insoluble fluid cell increases, the mixing subject liquid processing efficiency is degraded. Further, this leads to an increase in pressure loss or an unnecessary increase in insoluble fluid consumption amount. Accordingly, it is desirable to set the volume ratio from such a viewpoint. In general, it is desirable that the volume ratio be set in the range of $1/5$ to 4.

Furthermore, the mixing flow channel according to the present invention is not limited to the configuration with the groove formed on the base body as described above. For example, the mixing flow channel may be also formed by a pipe having a minute inner diameter.

EXAMPLES

Examples and Comparative Examples according to the present invention will be described. In Examples and Comparative Examples described below, aqueous sodium hydroxide (NaOH) was used as the first liquid and acetic acid aqueous solution was used as the second liquid. In order to neutralize both solutions, both liquids were mixed by using a device illustrated in FIGS. 1 to 6, and a distance (in the way of the mixing unit 54) and a time demanded for completing the neutralization were measured.

Common Condition in Examples (1) First and Second Liquids
  The first liquid and the second liquid were simultaneously supplied to the flow channel forming body FB so that the flow ratio became one to one.
  Both liquids were supplied at the normal temperature (about 20° C.) without using the constant-temperature bath 42.
  The completion of the neutralization was checked by the changed color (from blue to yellow) of a thymol blue mixed into the first liquid (aqueous sodium hydroxide).
  In order to adjust the viscosity, an appropriate amount of ethylene glycol was applied to the first liquid or the first and second liquids (Examples 3 and 4)
(2) Insoluble Fluid
  As the insoluble fluid, a nitrogen gas (Examples 1, 3, and 4) or dodecane (Example 2) was used. The nitrogen gas was supplied to the flow channel forming body FB by the internal pressure (the initial pressure of about 0.3 MPaG) of the gas cylinder (the insoluble fluid container 32) into which the nitrogen gas is pressed. The dodecane was supplied to the flow channel forming body FB by a dedicated pump. In any case, the supply flow rate is adjusted by the flow rate adjuster 36.
(3) Flow Channel Forming Body FB
  Material and plate thickness of a substrate 100: SUS316L and 0.8 mm
  Number of grooves 141 to 144: 15
  Depths of liquid grooves 141 and 142 and depth (radius of semi-circular cross-section) of insoluble fluid groove 143: 0.2 mm Overall length and depth (radius of semi-circular cross-section) of mixing groove 144: 3 m×0.45 mm Hole diameter of joining hole 150 and insoluble fluid introduction hole 153: 0.5 mm Comparative Example FIG. 8 illustrates the supply flow rates (which are the supply flow rates of each flow channel and are also the same in the other drawings) of the first liquid (aqueous sodium hydroxide) and the second liquid (acetic acid aqueous solution) in a case where the insoluble fluid is not supplied thereto and the demanded neutralization distance (the distance in which the fluid needs to flow through the mixing unit 54 until both liquids are completely neutralized). As illustrated in this drawing, when the supply flow rates of both liquids increase, the demanded neutralization distance also simply increases.

Example 1

The mixing method according to the present invention was performed by using 1N aqueous sodium hydroxide as the first liquid, 1N acetic acid aqueous solution as the second liquid, and a nitrogen gas as the insoluble fluid. Specifically, a relation among the nitrogen gas supply flow rate, the demanded neutralization distance, and the demanded neutralization time was examined by repeatedly and appropriately changing the nitrogen gas supply flow rate for each of the case where the flow rates of both solutions were adjusted to 0.5 ml/min and the case where the flow rates of both solutions were adjusted to 1 ml/min. The results are illustrated in FIGS. 9(*a*) and 9(*b*).

As obvious from these drawings, the demanded neutralization distance and the demanded neutralization time noticeably decrease as the nitrogen gas flow rate increases regardless of respective solutions as the first and second liquids, and when the nitrogen gas flow rate is 2 ml/min or more, the neutralization is completed instantly (within one second).

Example 2

The mixing method according to the present invention was performed by using 1N aqueous sodium hydroxide as the first liquid, 1N acetic acid aqueous solution as the second liquid, and dodecane which is an oily liquid as the insoluble fluid. Specifically, a relation between the dodecane supply flow rate and the demanded neutralization distance was examined by repeatedly and appropriately changing the dodecane supply flow rate for each of the case where the flow rates of both solutions were adjusted to 0.5 ml/min and the case where the flow rates of both solutions were adjusted to 1 ml/min. The results are illustrated in FIG. 10.

Figure 10:
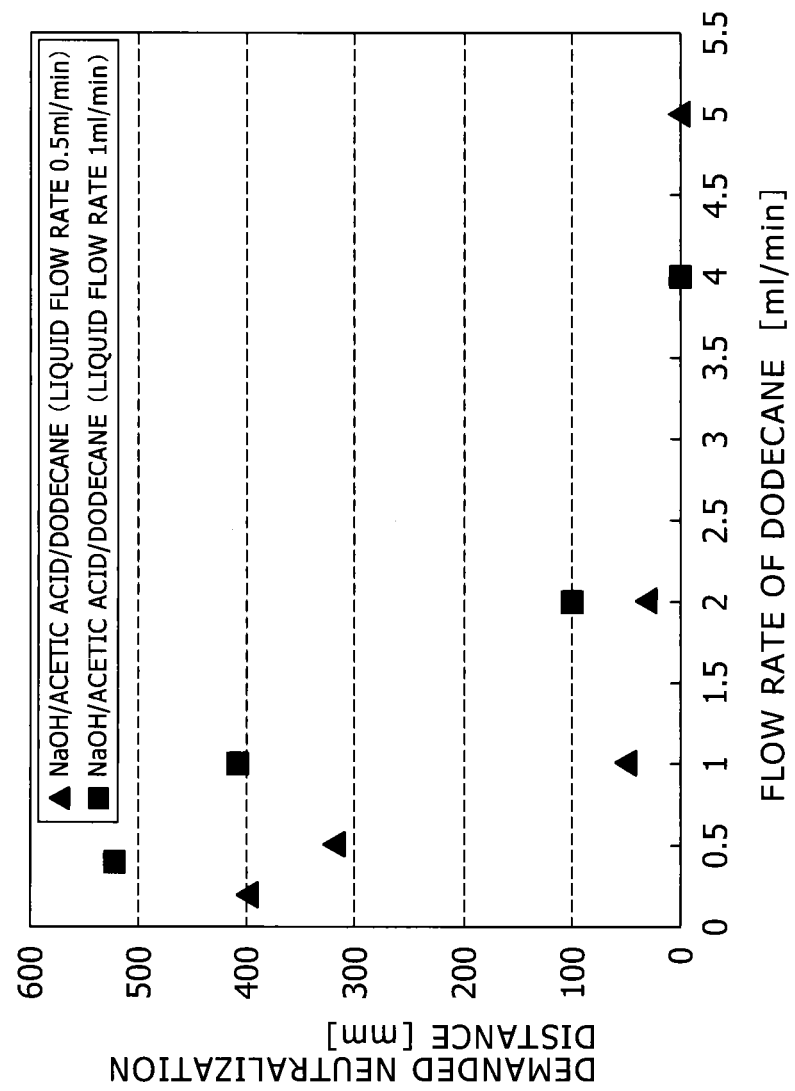
FIG. 10 is a graph illustrating a relation between a flow rate of dodecane and a distance demanded for neutralization in a second example of the present invention.

The graph of FIG. 10 is very similar to the graph of FIG. 9(*a*) of Example 1. This illustrates that the same mixing promotion effect according to the mixing method of the present invention may be obtained even when a liquid is used as the insoluble fluid. However, (although not illustrated in FIG. 10) the mixing promotion effect is decreased in the zone in which the dodecane flow rate is 10 ml/min or more. Although the reason will be described later, it is more desirable to use a gas as the insoluble fluid in order to stably form the slug flow. Further, the gas may be easily separated from the gas, which is completely mixed, in the recovery container 40.

Examples 3 and 4

In the same manner as Example 1, the mixing method according to the present invention was performed by using 1N aqueous sodium hydroxide as the first liquid, 1N acetic acid aqueous solution as the second liquid, and a nitrogen gas as the insoluble fluid. However, an experiment was performed by increasing the viscosity of the solution from 1.0 cP (@20° C.) to about 12.0 cP by adding ethylene glycol having viscosity of 23.5 cP (@20° C.) to the aqueous sodium hydroxide (Example 3) or adding ethylene glycol to both solutions (Example 4). The results are illustrated in FIG. 11.

The graph of FIG. 11 is also very similar to the graph of FIG. 9(*a*) of Example 1. This illustrates that the mixing promotion effect according to the mixing method of the present invention may be stably obtained even when the viscosities of the first and second liquids slightly increase or decrease (in the range without affecting the formation of the slug flow). Further, the fact that the above-described mixing promotion effect may be obtained regardless of the mixing of ethylene glycol which is an organic solvent indicates that the present invention may obtained the effect thereof not only in the case of mixing the solutions, but also the case of mixing oily liquids.

Furthermore, the mixing purpose according to the present invention is not limited to the neutralization. For example, the present invention may be applied to the mixing process for the reaction (reductive aldol reaction) of producing alcohol from an aldehyde compound. Specifically, in the case in which intermediate metal enolate is produced by a complete mixing process and a reaction of a first reactant ($R1=C=CCOR2$) and a second reactant (M-H metallic hydride), and then alcohol is produced by a reaction between the product and a third reactant $R_3$—CO—$R_4$, the present invention is applied to the process of mixing the first and second reactants. In this case, when the first and second reactants are respectively set as the first and second liquids and a nitrogen gas is introduced as the insoluble fluid after the first and second reactants are joined to each other, the slug flow is formed as described above, and hence the process of mixing both liquids may be promoted.

As described above, the present invention provides a method useful for mixing first and second liquids having mutual solubility and corresponding to the first and second liquids inside a mixing flow channel formed as a micro flow channel. This method includes: causing the first and second liquids to be joined to each other inside the mixing flow channel; and forming a slug flow, in which mixing subject cells formed by the joined liquid and insoluble fluid cells formed by an insoluble fluid are alternately arranged, inside a flow channel at the downstream side of an insoluble fluid supply position in a manner such that the insoluble fluid having insolubility with respect to both mixing subject liquids is supplied to the joined liquid flowing through the flow channel in a direction intersecting the flow channel so that the joined liquid is divided with a gap therebetween, thereby mixing the first mixing subject liquid and the second mixing subject liquid contained in each mixing subject cell inside the downstream flow channel.

In this method, since the process of mixing the first liquid and the second liquid is promoted by forming the slug flow in which the mixing subject cells formed by the first and second liquids joined to each other inside the mixing flow channel and the insoluble fluid cells formed by the insoluble fluid are alternately arranged, the mixing efficiency may be improved without complicating the flow channel shape or providing the voltage application unit as in the related art.

Here, the "first and second liquids having mutual solubility" indicate a fluid in which a mixed liquid formed by mixing such liquids is not separated into a laminar state even when the mixed liquid is held in a static state, and exemplified is a case in which both mixing subject liquids have a high hydrophilic property or a case in which both mixing subject liquids have a high lipophilic property. Meanwhile, as the "insoluble fluid having insolubility with respect to the first liquid and the second liquid", for example, oil or a gas (a nitrogen gas, an inert gas, a hydrocarbon gas, or the like) having low water solubility is exemplified when the first and second liquids have a high hydrophilic property or for example, water, a liquid having a high hydrophilic property, or a gas (a nitrogen gas, an inert gas, or the like) having low solubility with respect to oil is exemplified when the first and second liquids have a high lipophilic property.

The method according to the present invention further includes: separating the insoluble fluid from the mixing subject liquids after the first and second liquids are completely mixed with each other, and hence the originally desired mixed fluid may be obtained. In this case, a gas is used as the insoluble fluid, so that the insoluble fluid and the mixing subject liquid are noticeably and easily separated from each other.

As the mixing subject liquids of the present invention, that is, the first and second mixing subject liquids, for example, water-soluble liquids are desirable. In this case, a non-water soluble fluid may be used as the insoluble fluid, and particularly, a nitrogen gas or an inert gas is desirable.

In the present invention, the volume ratio between the mixing subject cell and the insoluble fluid cell in the slug flow may be freely set by adjusting the insoluble fluid introduction flow rate. As the volume of the mixing subject cell decreases, the mixing promotion effect is improved by the circulation flow. In contrast, when the occupancy of the volume of the insoluble fluid cell increases, the efficiency of processing the mixing subject liquid is degraded, so that the pressure loss increases or the unnecessary insoluble fluid consumption amount increases. From such a viewpoint, it is desirable to set the volume ratio to be equal to or larger than ½ and equal to or smaller than 2.

As the micro flow channel, for example, a micro flow channel formed by a groove formed in a base body may be used.

Further, the present invention provides a liquid mixing device best suitable for the above-described mixing process. The liquid mixing device includes: a flow channel forming body which forms a mixing flow channel for mixing first and second liquids having mutual solubility; a first liquid supply unit which supplies the first liquid to the flow channel forming body; a second liquid supply unit which supplies the second liquid to the flow channel forming body; and an insoluble fluid supply unit which supplies an insoluble fluid having insolubility with respect to both first and second liquids to the flow channel forming body. The mixing flow channel formed by the flow channel forming body includes a first liquid introduction unit into which the first liquid supplied from the first liquid supply unit is introduced, a second liquid introduction unit into which the second liquid supplied from the second liquid supply unit is introduced and which includes a terminal end communicating with a terminal end of the first liquid introduction unit so that the introduced second liquid is joined to the first liquid introduced to the first liquid introduction unit, a mixing unit which is connected to the terminal ends of both liquid introduction units and mixes the liquids joined to each other at the terminal ends in a flowing state, and an insoluble fluid introduction unit which includes a terminal end communicating with the mixing unit so as to form a slug flow, in which mixing subject cells formed by the joined liquid and insoluble fluid cells formed by an insoluble fluid are alternately arranged, inside the mixing unit at the downstream side of an insoluble fluid introduction position in a manner such that the insoluble fluid supplied from the insoluble fluid supply unit is introduced to the joined liquid flowing through the mixing unit at a middle position of the mixing unit in a direction intersecting the mixing unit.

As the flow channel forming body, a flow channel forming body is desirable which includes a base body provided with a groove forming the mixing flow channel and a lid body mounted on the base body so as to cover the groove. Particularly, since the base body is formed as a substrate having a first side surface and a second side surface at the rear side thereof and both side surfaces of the substrate are provided with a groove, it is possible to form a best suitable mixing flow channel by the above-described liquid mixing method in a compact structure. Specifically, the substrate may be provided with a first liquid groove which is formed in the first side surface and forms the first liquid introduction unit, a mixing groove which is formed in the first side surface so as to be connected to a terminal end of the first liquid groove and forms the mixing unit, a second liquid groove which is a groove formed in the second side surface and forming the second liquid introduction unit and has a shape in which a terminal end of the groove is located at the rear side of the terminal end of the first liquid groove, an insoluble fluid groove which is a groove formed in the second side surface and forming the insoluble fluid introduction unit and has a shape in which a terminal end of the groove is located at the rear side of a middle position of the mixing unit, a joining hole which penetrates the substrate in the thickness direction so that the terminal end of the first liquid groove communicates with the terminal end of the second liquid groove and causes the first liquid and the second liquid to be joined to each other, and an insoluble fluid introduction hole which penetrates the substrate in the thickness direction so that a middle portion of the mixing groove communicates with the terminal end of the insoluble fluid groove and enables the introduction of the insoluble fluid with respect to the liquid flowing through the mixing groove. Since the substrate uses both the first side surface and the second side surface, it is possible to efficiently perform, with a compact structure, a process in which the first liquid and the second liquid are joined to each other, the insoluble fluid is introduced to the joined liquid, and both liquids are mixed while the mixing state is promoted by the slug flow formed by the introduction. Furthermore, the promotion of the mixing process may shorten the length demanded for the mixing groove.

The invention claimed is:

1. A liquid mixing method of mixing first and second liquids having mutual solubility in a device comprising:
   a flow channel forming body which forms a mixing flow channel for mixing the first and second liquids with each other;
   a first liquid supply unit which supplies the first liquid to the flow channel forming body;
   a second liquid supply unit which supplies the second liquid to the flow channel forming body; and
   an insoluble fluid supply unit which supplies an insoluble fluid having insolubility with respect to both first and second liquids to the flow channel forming body,
   wherein the mixing flow channel formed by the flow channel forming body comprises a first liquid introduction unit into which the first liquid supplied from the first liquid supply unit is introduced, a second liquid introduction unit into which the second liquid supplied from the second liquid supply unit is introduced and which comprises a terminal end communicating with a terminal end of the first liquid introduction unit so that the introduced second liquid is joined to the first liquid introduced to the first liquid introduction unit, a mixing unit which is connected to the terminal ends of both liquid introduction units and mixes the liquids joined to each other at the terminal ends in a flowing state, and an insoluble fluid introduction unit which comprises a terminal end communicating with the mixing unit so as to form a slug flow, in which mixing subject cells formed by the joined liquid and insoluble fluid cells formed by an insoluble fluid are alternately arranged, inside the mixing unit at a downstream side of an insoluble fluid introduction position in a manner such that the insoluble fluid supplied from the insoluble fluid supply unit is introduced to the joined liquid flowing through the mixing unit at a middle position of the mixing unit in a direction intersecting the mixing unit, wherein the flow channel forming body comprises a base body which is provided with a groove forming the mixing flow channel and a lid body which is mounted on the base body so as to cover the groove, and wherein the base body is formed by a substrate having a first side surface and a second side surface opposite thereof, and wherein the substrate is configured with:

a first liquid groove which is formed in the first side surface and forming the first liquid introduction unit, a mixing groove which is formed in the first side surface so as to be connected to a terminal end of the first liquid groove and forming the mixing unit, a second liquid groove which is formed in the second side surface and forming the second liquid introduction unit and has a shape in which a terminal end of the groove is located at a rear side of the terminal end of the first liquid groove, an insoluble fluid groove which is formed in the second side surface and forming the insoluble fluid introduction unit and has a shape in which a terminal end of the groove is located at a rear side of a middle position of the mixing unit, a joining hole which penetrates the substrate in a thickness direction so that the terminal end of the first liquid groove communicates with the terminal end of the second liquid groove and causes the first liquid and the second liquid to be joined to each other, and an insoluble fluid introduction hole which penetrates the substrate in the thickness direction so that a middle portion of the mixing groove communicates with the terminal end of the insoluble fluid groove and enables the introduction of the insoluble fluid with respect to the liquid flowing through the mixing groove, the method comprising:

joining the first and second liquids to each other inside the mixing unit to obtain a joined liquid; and forming a slug flow, in which mixing cells formed by the joined liquid and insoluble fluid cells formed by an insoluble fluid are alternately arranged, inside the mixing groove in a manner such that the insoluble fluid having insolubility with respect to both the first and second liquids is supplied to the joined liquid flowing through the mixing move so that the joined liquid is divided with a gap therebetween, thereby mixing the first liquid and the second liquid contained in each mixing cell, wherein an introduction flow rate of the insoluble fluid is set so that a volume ratio between the mixing cell and the insoluble fluid cell in the slug flow is equal to or larger than ½ and equal to or smaller than 2.

2. The method according to claim 1, wherein the insoluble fluid is a gas.

3. The method according to claim 2, further comprising:
separating the insoluble fluid from the first and second liquids after the first and second liquids are completely mixed with each other.

* * * * *